US012690124B2

(12) United States Patent
Sperber et al.

(10) Patent No.: US 12,690,124 B2
(45) Date of Patent: Jul. 21, 2026

(54) HIGH-CURRENT ELEMENT FOR HIGH-CURRENT PRINTED CIRCUIT BOARDS

(71) Applicant: ZF Friedrichshafen AG, Friedrichshafen (DE)

(72) Inventors: Michael Sperber, Bayreuth (DE); Ake Ewald, Bayreuth (DE); Chandra Gupta Hazarika, Duliajan (IN)

(73) Assignee: ZF Friedrichshafen AG, Friedrichshafen (DE)

( * ) Notice: Subject to any disclaimer, the term of this patent is extended or adjusted under 35 U.S.C. 154(b) by 354 days.

(21) Appl. No.: 18/354,147

(22) Filed: Jul. 18, 2023

(65) Prior Publication Data

US 2024/0032187 A1     Jan. 25, 2024

(30) Foreign Application Priority Data

Jul. 19, 2022    (DE) .......................... 102022207360.6

(51) Int. Cl.
H05K 1/184          (2026.01)
B60R 16/03          (2006.01)
(Continued)

(52) U.S. Cl.
CPC ....... H05K 1/0265 (2013.01); B60R 16/0307 (2013.01); H01R 12/585 (2013.01);
(Continued)

(58) Field of Classification Search
CPC ... H01L 23/5385; H01R 12/58; H01R 12/585; H01R 12/7094; H01R 13/08;
(Continued)

(56) References Cited

U.S. PATENT DOCUMENTS 5,052,953 A * 10/1991 Weber .................. H01R 12/718
                                                          439/857
7,104,812 B1 * 9/2006 Bogiel ................. H01R 12/724
                                                          439/79
(Continued)

FOREIGN PATENT DOCUMENTS

DE      10 2014 221 089 A1     4/2016
DE      10 2020 128 367 A1     4/2022

OTHER PUBLICATIONS

Office Action dated Mar. 15, 2023 for German Patent Application No. 10 2022 207 360.6 (10 pp.), note: pp. 1 and 2 are English language Explanations to Section C. Result of Determination Document.

*Primary Examiner* — Timothy J Thompson
*Assistant Examiner* — Michael F Mcallister
(74) *Attorney, Agent, or Firm* — Crowell & Moring LLP

(57)          ABSTRACT

A high-current element for high-current printed circuit boards is formed from at least two metal sheets which are connected to form a sheet-metal stack and which have a plurality of pins at least at an end region thereof, and wherein the sheet-metal stack has a terminal region, a pin region, and a connection region, and wherein the metal sheets are connected to one another in the connection region, and the pins are arranged in the pin region and formed for contacting with the high-current printed circuit board, and the terminal region is set up to be used as a terminal region for connecting the high-current element to external power terminals.

17 Claims, 3 Drawing Sheets

(51) Int. Cl.
  *H01R 12/58*    (2011.01)
  *H01R 13/08*    (2006.01)
  *H05K 1/02*     (2006.01)
  *H01R 12/70*    (2011.01)

(52) U.S. Cl.
  CPC ......... *H05K 1/184* (2013.01); *H01R 12/7094*
     (2013.01); *H01R 13/08* (2013.01); *H05K*
          *2201/10272* (2013.01)

(58) Field of Classification Search
  CPC ...... H01R 43/16; H05K 1/0265; H05K 1/184;
        H05K 2201/10272; B60R 16/0307
  USPC ....................................................... 174/68.1
  See application file for complete search history.

(56) References Cited

U.S. PATENT DOCUMENTS 11,189,947 B2 *   11/2021   Schrader ............ H01R 12/7088
11,362,444 B2 *   6/2022   Schneider ............ H01R 4/2425
2006/0189222 A1    8/2006   Bogiel et al.
2019/0067167 A1 *   2/2019   Hong ................... H10W 70/22

* cited by examiner

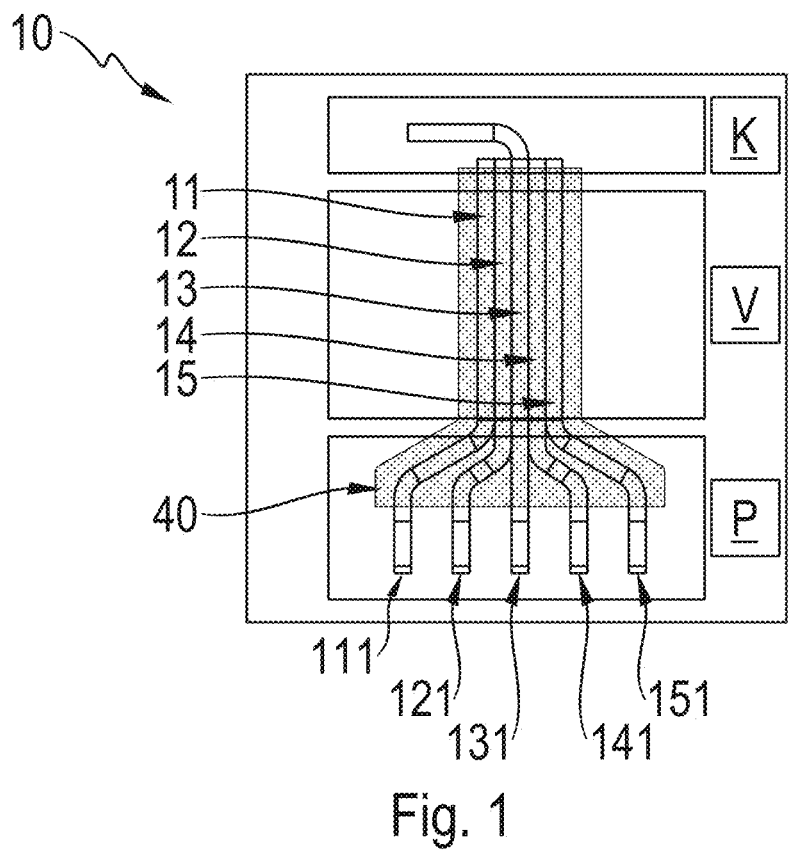
Fig. 1
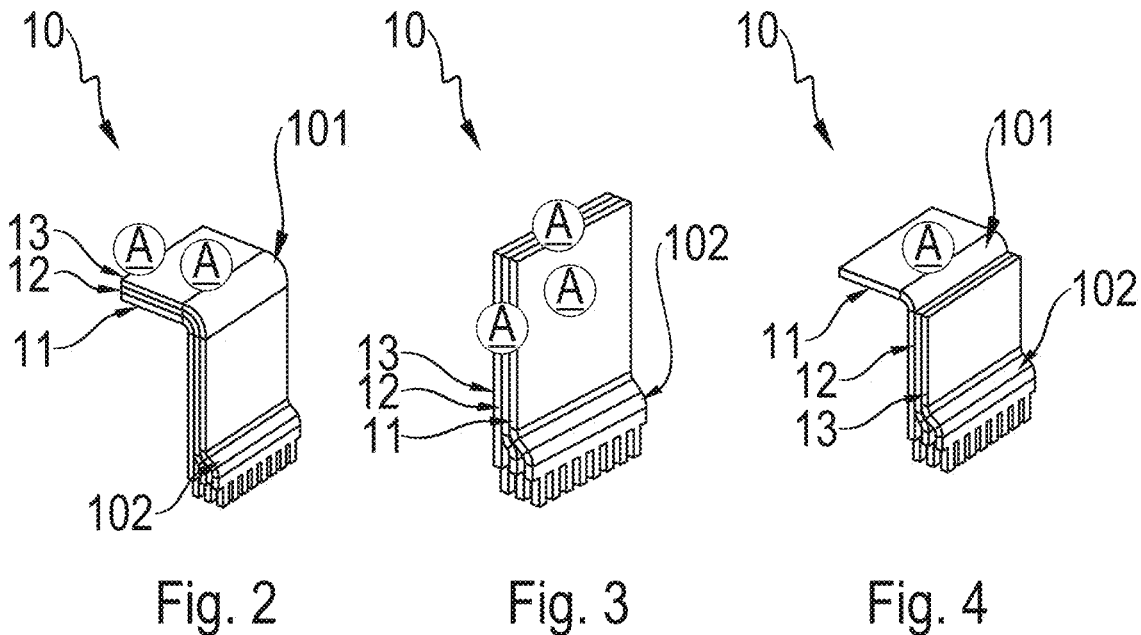
Fig. 2      Fig. 3      Fig. 4

HIGH-CURRENT ELEMENT FOR HIGH-CURRENT PRINTED CIRCUIT BOARDS

CROSS-REFERENCE TO RELATED APPLICATION

This application claims priority to German Application No. DE 10 2022 207 360.6, filed on Jul. 19, 2022, the entirety of which is hereby fully incorporated by reference herein.

FIELD

The present invention relates to the field of electromobility, particularly electronic modules for an electric drive.

BACKGROUND AND SUMMARY

In inverter applications, high-current printed circuit boards are also used in addition to dedicated busbars, in order to allow the conversion of DC to AC, DC to DC and AC to DC. Especially if there is a lack of availability of module solutions with the required number of power semiconductors, a printed circuit board solution may make sense, on which the individual semiconductors can be assembled into packages for the appropriate performance class. Whilst carrying the required currents in the printed circuit board constitutes a manageable problem, connecting the printed circuit board to the environment in the form of the DC supply lines and AC outgoing lines is a challenge. Possible connecting elements for connecting the lines/busbars at the high-current printed circuit board are currently massive, milled press-fit elements or sheet-metal elements. These connecting elements are very inflexible in terms of shaping, so adaptation to available installation space is very difficult or not possible. It is also not simple to adapt the connecting elements with regards to required current carrying capacities for DC and AC interfaces.

An object of the invention is therefore to provide an improved high-current element for high-current printed circuit boards and a method for producing the same.

This object is achieved by the features of the independent claims. Advantageous embodiments are the subject of the dependent claims.

A high-current element for high-current printed circuit boards is proposed, wherein the high-current element is formed from at least two metal sheets which are connected to form a sheet-metal stack and which have a plurality of pins at least at an end region thereof, and wherein the sheet-metal stack has a terminal region, a pin region and a connection region, and wherein the metal sheets are connected to one another in the connection region, and the pins are arranged in the pin region and formed for contacting with the high-current printed circuit board, and the terminal region is set up to be used as a terminal region for connecting the high-current element to external power terminals.

A plurality of layers of a high-current printed circuit board can be electrically connected to one another in a simple manner by means of the proposed high-current element and provide the electrical current carrying capacity required by the application in the process.

In an embodiment, the connection region merges into the terminal region in a straight-lined manner. Alternatively, the connection region merges into the terminal region in a bent manner, or at least one metal sheet of the connection region merges into the terminal region in a straight line or in a bend and the other metal sheet(s) end before the bend. The terminal region may also be part of the connection region.

Due to the option of configuring the terminal region flexibly, the contacting can be adapted to the installation space and therefore space can be saved.

In an embodiment, the connection region is arranged between the terminal region and pin region. Alternatively, the terminal region is part of the connection region and a pin region with pins in a pin bend adjoins both ends of the connection region in each case.

In an embodiment, either one or more intermediate layers are arranged between the metal sheets of the sheet-metal stack or the pins are fanned out in the pin region in at least one pin bend, in such a manner that the pins are located at a predetermined spacing and parallel to one another.

In an embodiment, the metal sheets are connected to one another in the connection region by means of positive or materially bonded joining.

In an embodiment, the high-current element is partially enclosed with a molding compound in the connection region, and/or the pins are partially or completely coated with an electrically conductive material.

In an embodiment, a pin region of the high-current element is formed in such a manner that the pin region can be inserted into a predetermined hole matrix of a high-current printed circuit board.

Furthermore, a high-current printed circuit board is proposed, having at least one region, which is formed as a hole matrix and is set up to provide electrical contacting of at least one copper layer of the high-current printed circuit board by introducing the described high-current element into the hole matrix.

Furthermore, the use of at least one described high-current element in a high-current printed circuit board is proposed as connection to a DC interface of a rechargeable battery and/or a battery and/or to an AC interface of an electric motor and/or for contacting DC and/or AC terminals of at least one power switch arranged on the high-current printed circuit board.

Furthermore, an inverter of an electronic module for activating the electric drive of a vehicle equipped with an electric drive is proposed, having at least one described high-current element.

Furthermore, an electric drive for a motor vehicle with at least one electric machine, one gear device and an electronic module with a described inverter is provided. In addition, a motor vehicle having the electric drive and/or the inverter and/or the described high-current element is provided.

In addition, a method for producing and assembling the high-current element is provided, wherein in a first step, metal sheets are separated from a sheet-metal blank in a single- or multi-step process and reshaped into a predetermined basic shape, and in a second step, the metal sheets are stacked to form a sheet-metal stack, which is joined by means of a joining process in the connection region, and in an optional third step, the sheet-metal stack is partially or completely coated, and/or in an optional fourth step, the sheet-metal stack is coated by an electrically non-conductive molding compound in the regions in which the sheet-metal stack is not joined, and in a fifth step, the assembly takes place either in that the high-current element is initially connected by means of the pins at the pin region to the high-current printed circuit board or external power terminals at the terminal region.

Further features and advantages of the invention can be found in the following description of exemplary embodiments of the invention, on the basis of the figures of the drawing, which shows details according to the invention, and in the claims. The individual features may each be realized individually separately or as several features in any desired combination in a variant of the invention.

Preferred embodiments of the invention are explained in more detail in the following on the basis of the attached drawing.

BRIEF DESCRIPTION OF THE DRAWINGS

FIG. 1 shows a schematic sectional illustration of a high-current element according to an embodiment of the present invention.

FIGS. 2, 3, and 4 show different structural embodiments of the high-current element of the present invention.

DETAILED DESCRIPTION

In the following descriptions of the figures, the same elements or functions are provided with the same reference signs.

The basic concept of the present disclosure is to provide a beneficial power connection of a high-current printed circuit board 20 to external power terminals, which is flexible in terms of the shape thereof and is optimally scalable for various current requirements. This power connection is realized in the form of a high-current element 10. The term high-current is understood to mean currents above 100 A.

The basic structure of the high-current element 10 is such that the high-current element is formed as a sheet-metal stack which is divided into three regions. A first region is a connection region V made up of a plurality of (at least two) metal sheets 11-15, which are connected to one another. The number of the metal sheets 11-15 is chosen in accordance with the application and required current carrying capacity. The second region is a pin region P. Here, the metal sheets 11-15 in each case have a plurality of pins 111-151, which are arranged in a comb-like manner, for contacting with a high-current printed circuit board 20. The third region, which is located on the other side of the connection region V, is formed as a terminal region K for connecting the high-current element 10 to supply or outgoing lines for the system current (from or to battery or electric motor). A sectional illustration is shown in FIG. 1.

Figures 7, 8:
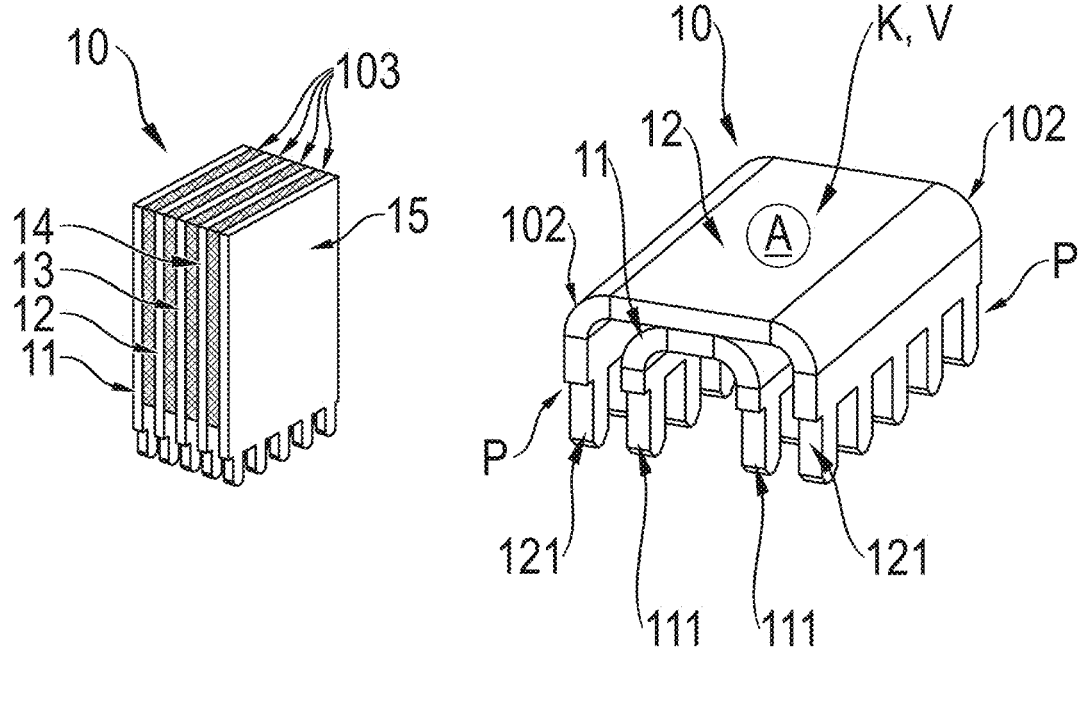
FIGS. 7 and 8 show different structural embodiments of the high-current element of the present invention.

The terminal region K may also not visibly be separate from the connection region V, so that the part of the connection region V at which the contacting with external power terminals takes place is termed terminal region K. The terminal region K is shown in FIGS. 2,3 and 8 with the A inside the circle.

The electrical contacting in the terminal region K can take place in all of the described embodiments by means of a suitable contact element or a suitable contacting at the points marked with the A in the circle.

The metal sheets 11-15 are connected to one another in the connection region V, that is to say between the pin region P and the terminal region K, in such a manner that the pins 111-151 point in the same direction, in order to be connected to the high-current printed circuit board 20. The connection of the metal sheets 11-15 to form a sheet-metal stack in the connection region V takes place by means of positive or materially bonded joining, e.g. by means of a resistance, friction or laser welding process or a soldering process. The length of the connection region V can be adapted in accordance with the application.

In an embodiment, the metal sheets 11-15 can be fanned out by upward bending (by means of pin bend 102) upstream of the pin region P, at which the pins 111-151 are located, in order to provide a predetermined spacing between the pins 111-151 of the metal sheets 11-15 and as a result to fit into the corresponding contact points of the high-current printed circuit board 20. Alternatively, one or more spacer sheets can, as shown in FIG. 7, be provided as intermediate layers 103 between the mutually connected metal sheets 11-15 in each case. Due to the intermediate layers 103, the pins 111-151 can be arranged in a spacing from one another, which corresponds to the hole spacing in the high-current printed circuit board 20, without a reshaping process, such as bending. Due to the insertion of the intermediate layers 103, the connection and terminal region K can additionally be realized to be more massive and/or more extensive, for contacting with external power terminals, such as busbars 21.

The fastening of the pins 111-151 in the high-current printed circuit board 20 takes place by means of positive compression or soldering.

Different embodiments of a described high-current element 10, which is formed of three metal sheets 11-13, are illustrated in FIGS. 2 to 4. FIG. 2 shows a high-current element 10, in which all three metal sheets 11-13 are bent between connection region V and terminal region K, that is to say have a bent terminal region K, and end at the same end point. A straight-lined metal-sheet pack is provided in FIG. 3. Therefore, in the embodiments shown in FIGS. 2 and 3, all three metal sheets 11-13 are used as a connection of the high-current element 10 to supply or outgoing lines for a system current. In this respect, in these embodiments, the connection region V merges into the terminal region K or terminal region K is part of the connection region V.

In FIG. 4, only one of the three metal sheets, metal sheet 11 here, is bent between connection region V and terminal region K, whilst the other metal sheets end before the bend 101. Therefore, only metal sheet 11 is used for connecting the high-current element 10 to supply or outgoing lines for a system current.

In all of the embodiments shown in FIGS. 2 to 4, a plurality of pins 111-131 per metal sheet 11-13 are present in the pin region P. The metal sheet 11 is straight-lined, whilst the metal sheets 12 and 13 lead away from the first metal sheet 11 in a region above the pins 12,13 in at least one pin bend 102, so that a spread region is created. This spread region is used to fan out the pins 12,13, that is to say to arrange the pins at a predetermined spacing from the respectively other pins 11-13. In principle, all pins 11-15 can be guided in a pin bend 102 in the pin region P, i.e. it is not absolutely necessary for one of the metal sheets 11 to be straight, as illustrated in the figures. However, all pins 11-13 are always parallel to one another and end at the same end point.

The terminal region K is used for connecting the high-current element 10 to the supply or outgoing lines for the system current (that is to say from the battery or to the electric motor). As can be seen in FIGS. 2 to 4, this can be realized differently, depending on the application. The terminal is always flat and can be guided out of the connection region V in a straight-lined or bent manner, wherein the angle can be chosen freely here or is chosen appropriately for the terminal to be contacted, depending on the application. In this case, all, a plurality or a single metal sheet 11-15 can be guided out as a terminal. If not all metal sheets 11-15 are guided out of the pack into the terminal region K, the optimum metal sheet 11-15 for the terminal can be chosen in each case. Soldering, welding or screwing processes can be used for joining the terminal region K. In the case of screwing processes, both screw-in and screw-through processes are conceivable. The connection is possible from various directions, as is illustrated schematically in FIGS. 2 to 4 by the marking of the circled A.

Figures 5, 6:
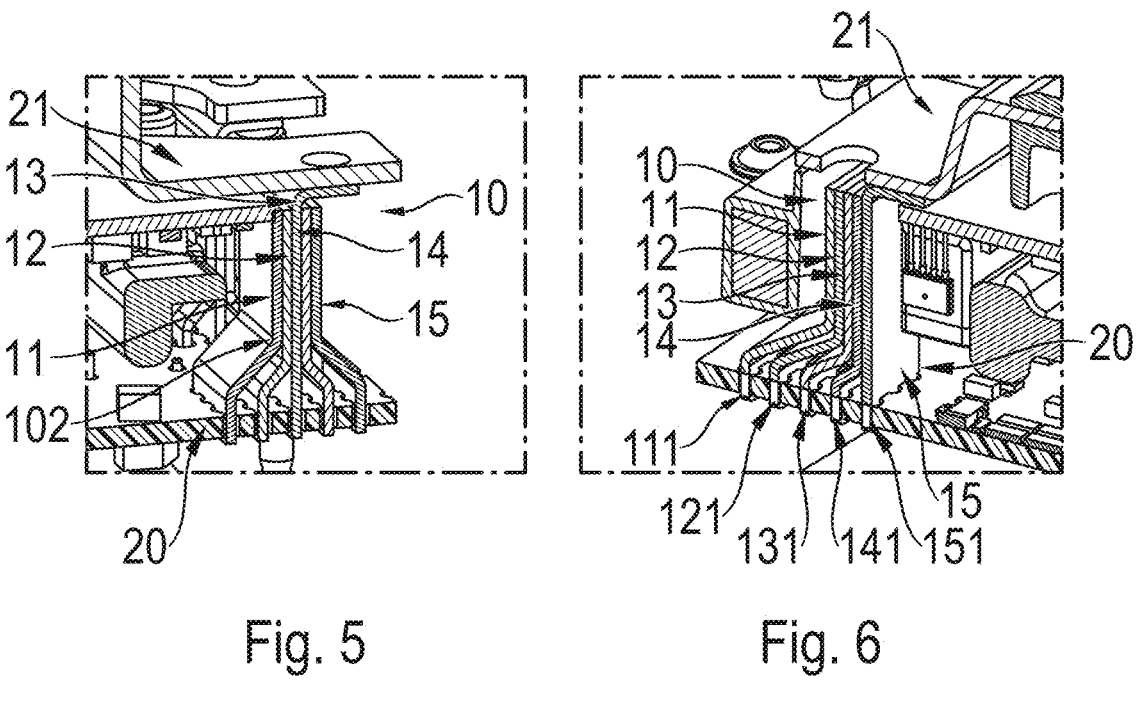
FIGS. 5 and 6 show different installation situations of high-current elements according to the present invention.

In FIGS. 5 and 6, high-current elements 10 with five metal sheets 11-15 are shown in exemplary installation situations, wherein the pins 111-151 thereof are connected to a high-current printed circuit board 20. In FIG. 5, the sheet-metal stack is illustrated with a centrally convergent (to metal sheet 13) spread region in the region of the pins 111-151. In addition, the sheet-metal stack has a single connection plate (metal sheet 13) which is guided out centrally and which is in contact with a busbar 21. A sheet-metal stack with a laterally convergent spread region in the region of the pins 111-151 is illustrated in FIG. 6. Here also, a single connection plate (metal sheet 15) is provided, which in this embodiment is guided out laterally, i.e. at an outermost point, which connection plate is contacted with a busbar 21.

In a further embodiment, which is shown in FIG. 8, a flat version is realized by means of contacting on both sides of the metal sheet with pins 111-151. Here, the terminal region K is part of the connection region V, i.e. at both ends of the connection region V in each case, a pin region P is present, on which pins 111-151 are provided. The connection region V is realized in a straight-lined manner, in order to provide flat contacting in the terminal region (labeled with circled A). The connection region V has a pin bend 102 at both ends, on which the pins 111-151 are arranged. In this embodiment, a plurality of metal sheets, here only two metal sheets 11 and 12, are likewise provided, which are formed in the same way and are arranged above one another. In this case, the inner metal sheet 11 is smaller in each case than the following outer metal sheet 12 (similarly to a Russian doll). The spacing of the pins 111-151 from one another is determined in this case by the size of the respective connection region V and the radius of the pin bend 102.

In all embodiments, the high-current element 10 can be partially overmolded at least in the connection region V for stabilization or insulation, that is to say enclosed with an electrically non-conductive molding compound 40, as indicated in FIG. 1. This can be used as insulation, in order to provide e.g. corrosion protection or electrical insulation.

In addition, the pins 111-151 can be coated partially or completely with an electrically conductive material for better electrical connection. For example, pins 111-151, which are made from brass, can additionally be tin-coated.

Figure 9:
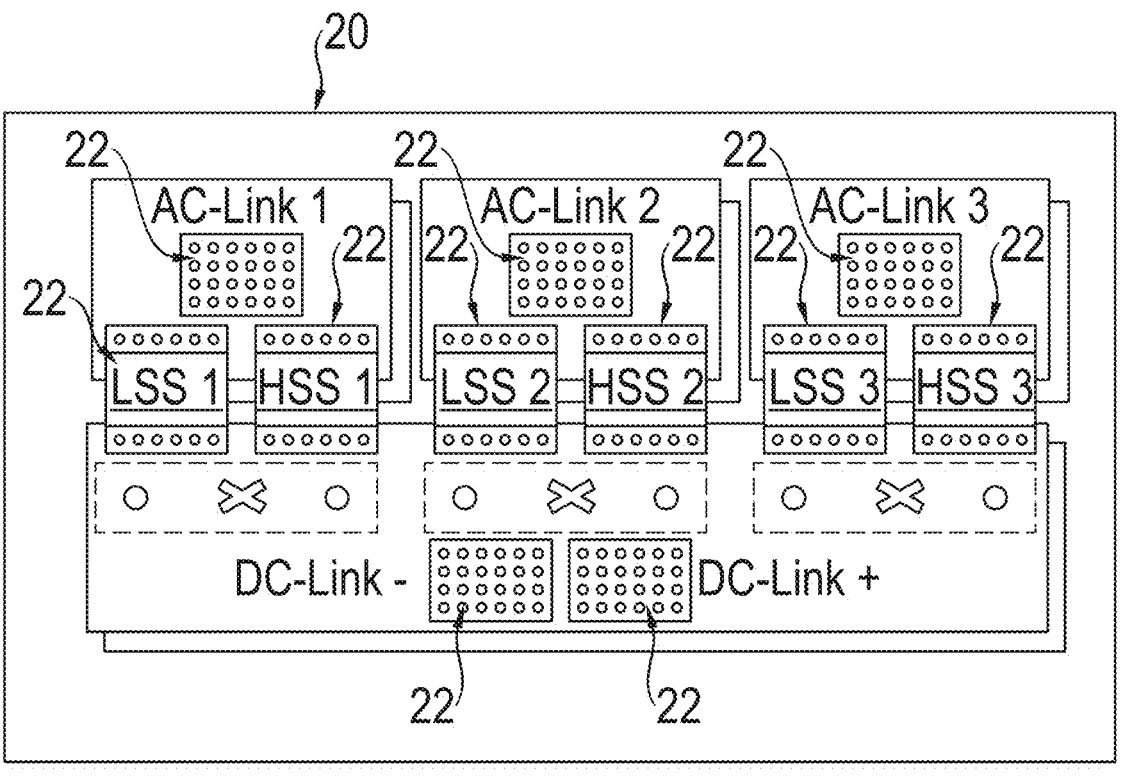
FIG. 9 shows a schematic illustration of a high-current printed circuit board with a hole matrix for mounting high-current elements according to an embodiment of the present invention.

FIG. 9 shows a design of a high-current printed circuit board 20 for the proposed high-current elements 10 by way of example. The high-current printed circuit board 20 has a hole matrix 22, which allows contacting to the corresponding current-carrying planes. The connection of the high-current element 10 to the high-current printed circuit board 20 takes place via regularly distributed pins 111-151 (in a comb-like manner) on the individual metal sheets 11-15. The pins 111-151 can be adapted to the hole matrix 22 by means of the proposed high-current element 10. That is to say, the high-current element 10 can be adapted to a predetermined number of rows and columns and therefore essentially any shape of contacting is possible, that is to say not only square, but also rectangular shapes.

The assembly takes place by means of mechanical pressing of the pins 111-151 into a defined press fit or by means of an adapted soldering process, which can be realized either as a reflow or selective soldering process. Alternatively, the connection can take place by means of a pin-in-paste method, in order to avoid additional thermal stress on the printed circuit board.

The interfaces (hole matrix 22) on the high-current printed circuit board 20 are characterized in that a matrix of plated-through holes extends at these points, through which holes the high-current elements 10 are guided in the course of an assembly process, so that copper layers of the high-current printed circuit board 20 are electrically conductively connected to the high-current elements 10. It is particularly advantageous here that the number of rows and columns of the matrix formed by the hole matrix 22 is freely configurable and can be adapted to the available space for the connection and to the required current carrying capacity.

In the design according to the present disclosure, high-current elements 10 are used at the following points:

At the DC interface (DC link), i.e. at the connection of the high-current printed circuit board 20 to the battery or the rechargeable battery. Here, a connecting point is provided for each DC potential. Thus, at least two DC high-current elements 10 are used. Optionally, DC high-current elements 10 can be used, distributed at various points on the high-current printed circuit board 20. For example, a DC high-current element pair can be provided for each half bridge.

At the AC interfaces (AC link 1-3), i.e. at the connection of the high-current printed circuit board 20 to the electric motor. Here, a high-current element 10 is provided for each phase.

Optionally, high-current elements 10 can also be used in the region of the power switches HSS 1-3 (high side); LSS 1-3 (low side). Here, the DC terminals and the AC terminal of the power switches HSS 1-3; LSS 1-3 can in each case be connected by means of a high-current element 10 to the high-current printed circuit board 20.

These connections being realized by through hole technology creates the advantage that a metallically filled connection to all copper layers of the high-current printed circuit board 20 can be provided by means of the connection process. This allows a thermally and electrically low-impedance connection, and also a very space-saving structure. Alternatively to the suggested solution, the connection would have to be provided by means of very many vias, which would be inserted in a labor-intensive manner in the manufacturing process of the high-current printed circuit board 20. These vias are not metallically filled and therefore have disadvantages with regards to current carrying capacity, thermal and electrical impedances, and also the necessary space requirement.

Figure 10:
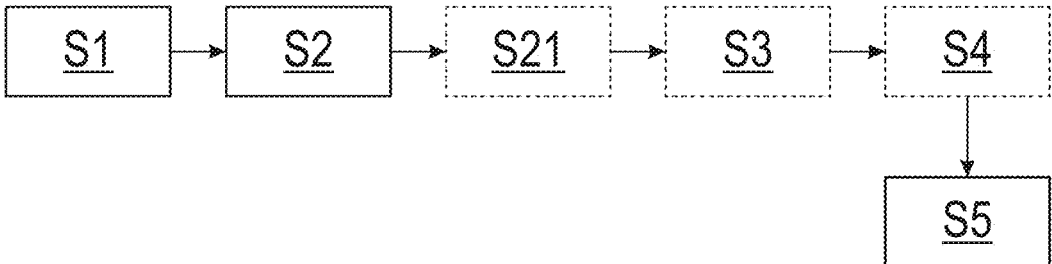
FIG. 10 shows a schematic sequence of the production method of a high-current element according to an embodiment of the present invention.

Furthermore, a production process and an assembly process are provided, which allows the production and application of high-current elements 10 according to the present disclosure in a multi-step flexible process. The sequence of the method is illustrated in FIG. 10.

During the production process, initially (Step S1) the individual metal sheets 11-15 are separated from a sheet-metal blank in a single- or multi-step process, e.g. by stamping or laser welding, and reshaped into the appropriate basic shape, e.g. by pressing. The production of the spread angles (pin bend 102) and/or the terminal bend (bend 101) also takes place here. If necessary, the pins 111-151 or pin tips can also separately be shaped/tolerated in a process step here, in order to achieve the necessary fits.

In the next step (S2), the individual metal sheets 11-15 are stacked to form a sheet-metal stack, which is then joined in the connection region V by means of one of the above-described joining processes. If necessary, the sheet-metal stack can go to a further reshaping process, which shapes the terminal region K (S21), that is to say e.g. fans out the pins 111-151.

In the following optional step (S3), the sheet-metal stack can be partially or completely coated. This process can facilitate the press fitting into the high-current printed circuit board 20 and prevent possible corrosion at the component over the service life. A partial coating may be used in a welding process in terminal region K, in order to allow a simple joining process there.

In a further optional process step (S4), the sheet-metal stack can also be coated or overmolded by an electrically non-conductive compound (molding compound e.g. plastic, in the regions in which the sheet-metal stack is not joined. This allows corrosion protection, as well as possible insulation for components in the environment, and also holding/positioning points for the assembly of the component or adjacent components. This process step (S4) can also be performed if the optional process step S3 was not performed.

During the assembly (Step S5), it is fundamentally possible to connect the high-current element 10 first to the high-current printed circuit board 20 (at pin region P) or external power terminals (at terminal region K) and then to the other partner in each case.

The described high-current element 10 can be used in inverter applications in the field of electric drives of vehicles, particularly passenger cars and commercial vehicles, and also buses, as the high-current element can also be designed for large currents required in these applications.

LIST OF REFERENCE SIGNS

10 High-current element
11-15 Metal sheets
111-151 Pins
101 Bend at E2
102 Pin bend at E1
103 Intermediate layers
20 High-current printed circuit board
21 Busbar
22 Hole matrix
40 Molding compound
P Pin region
K Terminal region
V Connection region
A in a circle Contacting with a contacting element
AC link 1-3 AC connection 1-2
HSS 1-3 High side switch 1-3
LSS 1-3 Low side switch 1-3

The invention claimed is:

1. A high-current element for high-current printed circuit boards, comprising:
at least two metal sheets which are connected to form a sheet-metal stack and which have a plurality of pins at least at an end region thereof, wherein the sheet-metal stack has a terminal region, a pin region, and a connection region,
wherein the metal sheets are connected to one another in the connection region, and the pins are arranged in the pin region and formed for contacting with the high-current printed circuit board, and the terminal region is configured to be used as a terminal region for connecting the high-current element to external power terminals, and
wherein one of:
the connection region merges into the terminal region in a bent manner, or
at least one metal sheet of the connection region merges into the terminal region in a bend, and the other metal sheets end before the bend.

2. The high-current element according to claim 1, wherein the terminal region is part of the connection region.

3. The high-current element according to claim 1, wherein the connection region is arranged between terminal region and pin region.

4. The high-current element according to claim 1, wherein either one or more intermediate layers are arranged between the metal sheets of the sheet-metal stack.

5. The high-current element according to claim 1, wherein the pins are fanned out in the pin region in at least one pin bend, in such a manner that the pins are located at a predetermined spacing and parallel to one another.

6. The high-current element according to claim 1, wherein the metal sheets are connected to one another in the connection region by a positive or materially bonded joining.

7. The high-current element according to claim 1, wherein the high-current element is partially enclosed with a molding compound in the connection region.

8. The high-current element according to claim 1, wherein the pins are partially or completely coated with an electrically conductive material.

9. The high-current element according to claim 1, wherein the pin region is formed in such a manner that the pin region is configured to be inserted into a predetermined hole matrix of the high-current printed circuit board.

10. A high-current printed circuit board comprising at least one region which is formed as a hole matrix and is configured to provide electrical contacting of at least one copper layer of the high-current printed circuit board by connection of the high-current element according to claim 1 into the hole matrix.

11. The high-current element according to claim 1, wherein the high-current element is arranged on the high-current printed circuit board and is configured as a connection to at least one of a DC interface of a rechargeable battery and/or a battery, an AC interface of an electric motor, and/or DC and/or AC terminals of at least one power switch arranged on the high-current printed circuit board.

12. An inverter of an electronic module for activating an electric drive of a vehicle, comprising at least one high-current element according to claim 1.

13. An electric drive for a motor vehicle comprising:
at least one electric machine;
a gear device; and
the electronic module with the inverter according to claim 12.

14. A motor vehicle comprising the electric drive according to claim 13.

15. A method for producing and assembling a high-current element, comprising:
separating metal sheets from a sheet-metal blank in a single-step or multi-step process;

reshaping the metal sheets into a predetermined basic shape;

stacking the metal sheets to form a sheet-metal stack;

joining the sheet-metal stack by a joining process in a connection region thereof;

coating the sheet-metal stack partially or completely; and connecting the high-current element initially by connecting the pins at the pin region to the high-current printed circuit board and/or connecting external power terminals at a terminal region of the high-current element.

16. The method according to claim 15, comprising:

coating the sheet-metal stack with an electrically nonconductive molding compound in regions in which the sheet-metal stack is not joined.

17. A high-current element for high-current printed circuit boards, comprising:

at least two metal sheets which are connected to form a sheet-metal stack and which have a plurality of pins at least at an end region thereof, wherein the sheet-metal stack has a terminal region, a pin region, and a connection region, wherein the metal sheets are connected to one another in the connection region, and the pins are arranged in the pin region and formed for contacting with the high-current printed circuit board, and the terminal region is configured to be used as a terminal region for connecting the high-current element to external power terminals, and wherein either one or more intermediate layers are arranged between the metal sheets of the sheet-metal stack.

* * * * *